United States Patent [19]

Greenstein et al.

[11] Patent Number: 5,694,403
[45] Date of Patent: Dec. 2, 1997

[54] SYSTEM AND METHOD FOR SEQUENTIAL VECTOR COMPACTION IN THE PRESENCE OF MULTIPLE THREE-STATE BUSSES

[75] Inventors: Gary Greenstein, Framingham, Mass.; Thomas M. Niermann, Portola Valley, Calif.

[73] Assignee: Viewlogic Systems, Inc., Marlboro, Mass.

[21] Appl. No.: 679,465

[22] Filed: Jul. 3, 1996

[51] Int. Cl.$^6$ .................................................. G06F 11/00
[52] U.S. Cl. ................................................................ 371/27
[58] Field of Search ........................... 371/27, 22.1, 22.4, 371/22.5

[56] References Cited

U.S. PATENT DOCUMENTS 5,390,193  2/1995  Millman et al. ........................ 371/27
5,457,697  10/1995  Malleo-Roach et al. ............... 371/22.3

Primary Examiner—Vincent P. Canney
Attorney, Agent, or Firm—Hale and Dorr LLP

[57] ABSTRACT

A system and method for resolving three-state busses while generating a compact vector set which will detect as many stuck-at faults as possible. Two passes are made through the circuit design. In the first pass, all three-state busses in the design are satisfied at the same time to eliminate conflicts on all of the busses and the ordered pairs of inputs for resolving the bus are saved. In the second pass, a primary fault is targeted and a sequence is generated to detect the fault and is saved for later reference. Then secondary faults are targeted to find input sets that will detect the secondary faults and if such inputs will also satisfy all of the three-state busses, the primary inputs for the secondary fault are saved.

10 Claims, 6 Drawing Sheets

SYSTEM AND METHOD FOR SEQUENTIAL VECTOR COMPACTION IN THE PRESENCE OF MULTIPLE THREE-STATE BUSSES

BACKGROUND OF THE INVENTION

This invention relates to automatic test pattern generation and more particularly to an automatic test pattern generation system and method which resolves three-state busses in a non-conflicting matter by performing vector compaction.

Automatic Test Pattern Generation ("ATPG") is a process utilized by a chip manufacturer to generate test vectors for a circuit design for the purpose of finding manufacturing defects in a chip. Sequential ATPG is a type of automatic test pattern generation which does not assume that all of the storage elements of the design under test are accessible through the scan chains.

One of the types of faults that ATPG processes will seek to detect is a "stuck-at fault" which is a model of a manufacturing defect of a chip in which a node in a circuit is always driven to a given value. Performing sequential ATPG for stuck-at faults or other fault models is a very complex problem. In addition, there are a significant number of requirements that must be met for any ATPG procedure to detect a given fault and the number of these requirements increases with size of the circuit, the number of the storage elements in the design and the complexity of the interconnection of the storage elements.

Unique problems arise when a circuit has three-state busses. A three-state bus is a set of three-state drivers that all drive the same output net. A three-state driver is a subcircuit of transistors found in circuit designs, in which the output of the subcircuit might not be actively driven to 1 (VDD) or 0 (GND), but to a third state which is generally referred to as the "floating" or "Z" state. If a circuit has three-state busses, the ATPG procedure should ensure that there are no conflicts on those busses.

Depending on the foundry, a conflict will fall into one of three categories, which for purposes of this discussion will be identified as TSres, TSmax1, and TSminmax1. A TSres conflict occurs if any drivers are driving a 1, and there are no drivers driving a 0 and visa versa. A TSmax1 conflict occurs when no more than one driver is actively driving a value. A TSminmax1 conflict occurs when exactly one driver is actively driving a value. For large designs with thousands of three-state busses, the ATPG procedure might spend more time and effort handling the three-state busses then it does with the original stuck-at fault being targeted.

An additional requirement for sequential ATPG procedures is the generation of as few vectors as possible to test the circuit. There are several heuristics for performing vector compaction. Many such heuristics attempt to use the unset primary inputs to detect faults other than the primary targeted fault. However, in the presence of many three-state busses, this approach will likely fail. In order to resolve the three-state busses most of these other inputs will need to be set, or will be unobservable through the three-state busses.

Many existing prior art systems will describe sequential vector compaction but these systems do not resolve three-state busses. The only known sequential ATPG system which provides for three-state resolution is described in "Compact Test Sets For Industrial Circuits" by Konignenburg, et al., Proceedings 13 VLSI Test Symposium, Apr. 30–May 3, 1995. The system described in the Konignenburg, et al. paper, however, was slow and inefficient as it resolved all three-state busses by a "brute" force method that required that all of the busses be resolved for each set of primary inputs that have been tested.

It is therefore a principal object of the present invention to provide a sequential ATPG system and method which resolves conflicts on three-state busses in a circuit design which are found to be conflicting.

It is a further object of the present invention to provide a sequential ATPG system and method which generates very compact vector sets while still having the ability to resolve conflicts.

SUMMARY OF THE INVENTION

Accordingly, the present invention provides a system and method for resolving three-state busses while generating a compact vector set which will detect as many stuck-at faults as possible. Two passes are made through the circuit design. In the first pass, all three-state busses in the design are satisfied at the same time to eliminate conflicts on all of the busses and the ordered pairs of inputs for resolving the bus are saved. In the second pass, a primary fault is targeted and a sequence is generated to detect the fault and is saved for later reference. Then, secondary faults are targeted to find input sets that will detect the secondary faults and if such inputs will also satisfy all of the three-state busses, the inputs for the secondary fault are saved.

These and other features and objects of the present invention will be more fully understood from the following detailed description which should be read in light of the accompanying drawings.

DETAILED DESCRIPTION OF THE PREFERRED EMBODIMENT

Figure 1:
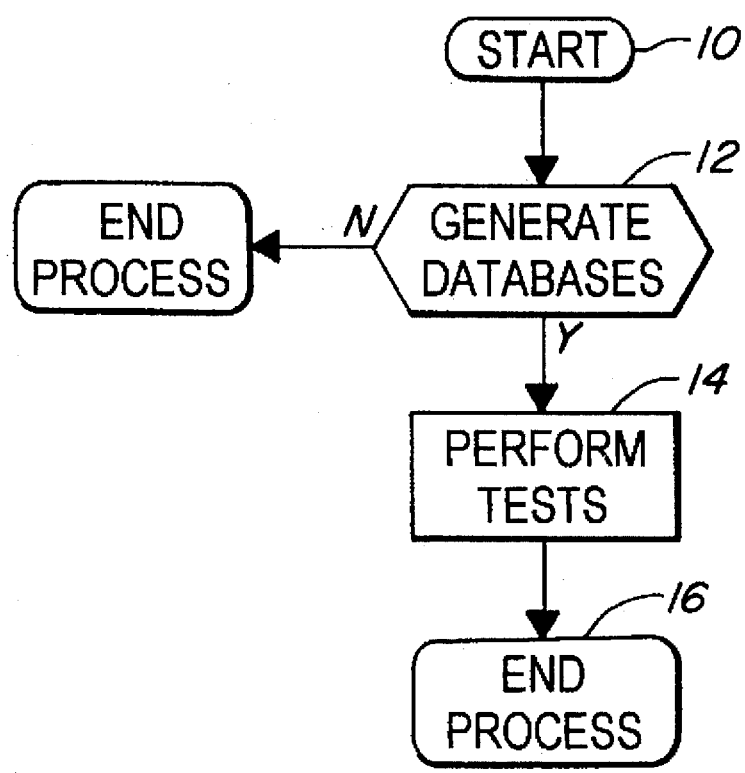
FIG. 1 is a flowchart showing the overview of a circuit test procedure.

The system and method of the present invention is a sequential ATPG system and method designed to resolve three-state busses in a circuit design while still generating compact vector sets. The system and method perform dynamic vector compaction which takes special care to ensure that each vector sequence generated will detect as many stuck-at faults as possible.

The operation of the sequential ATPG system and method of the present invention will now be described. The system and method make two passes through the circuit design. In the first pass all of the three-state busses in the design are satisfied at the same time so there are no conflicts in any bus. This is achieved primarily by assigning different values at different times to the primary inputs. For each bus, the minimum set of ordered pairs of primary inputs are memorized (saved to memory 202) as part of a vector sequence to ensure resolving the bus.

In the second pass, a standard dynamic vector compaction framework is utilized. A primary fault is targeted, and a sequence is generated to detect the fault. Unassigned inputs are left unassigned and three-state busses are potentially left unresolved. The system then performs compaction during which time a secondary fault is selected and is targeted in the circuit given the existing values at primary inputs. If a vector sequence is found that detects the secondary fault then the process verifies that all three-state busses can still be satisfied by the vector sequence generated to detect the secondary fault. The primary input sets from the memorized sequence are applied to the circuit provided that they do not conflict with the existing primary input values chosen in the current vector sequence generated to detect the secondary fault. If a memorized sequence for a given three-state bus conflicts with the primary input assignments in such current vector sequence, then the system derives a new sequence for detecting the secondary fault in such bus that is compatible, using any commercially available ATPG test product, such as the TestGen product distributed by Viewlogic Systems, Inc., the assignee of the present application. If such a sequence cannot be found, or if all of the three-state busses cannot be satisfied by the vector sequence generated to detect the secondary fault, then the primary input values needed to detect the secondary fault are discarded. In such a case, the secondary fault cannot be detected while the current primary fault is detected. If the busses can be satisfied by such current vector sequence for the secondary fault, then for each bus that was satisfied by using primary inputs other than the memorized solution, those primary inputs are saved as part of the memorized vector sequence. All other primary input assignments set only for the purpose of satisfying the three-state busses are then removed. This process continues until designated convergence criteria are met. The three-state busses are resolved for the sequence, again using memorized solutions if possible. Finally, the unused inputs are randomly assigned, the sequence is fault simulated and any detected faults are dropped from the master fault list.

This process will now be described in greater detail. FIG. 1 shows an overview of the operation of the sequential ATPG system and method of the present invention. In step 12, a database of all three-state busses is created and in step 14 the tests to detect faults are performed.

Figure 2:
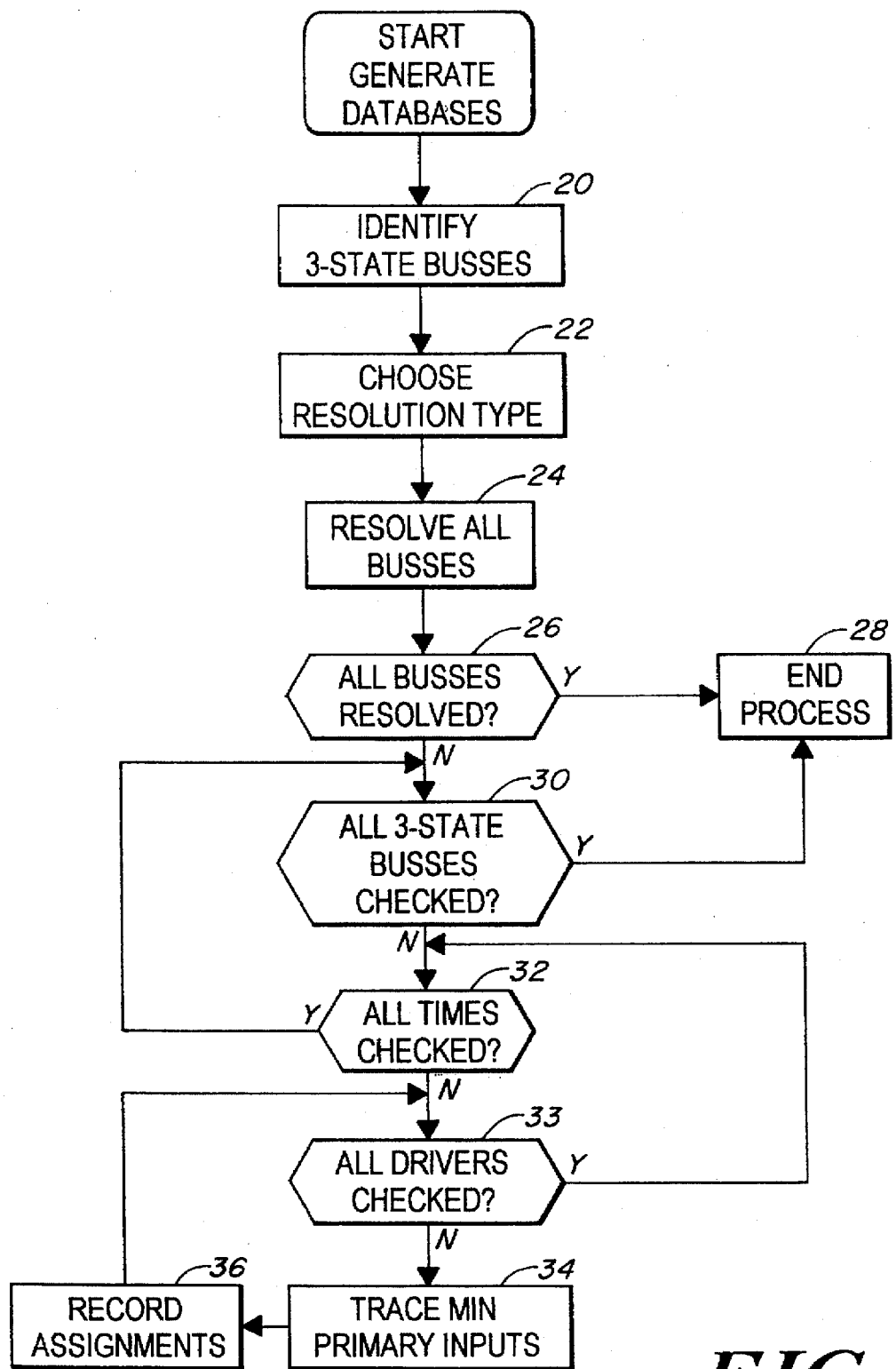
FIG. 2 is a flowchart showing the steps used by the system and method of the present invention for generating a database of three-state busses.

The process for generating the databases is shown in FIG. 2. The first step taken by the system is to identify all three-state busses in the circuit design in step 20. In step 22, the resolution type is chosen. The resolution type is a user input and in the preferred embodiment, the resolution type may be TSres, TSmax1, or TSminmax1, as described above. In step 24, all of the busses are resolved using any commercially available ATPG test product, such as the TestGen product. The system then determines in step 26 whether all busses have been resolved, and if all busses can not be resolved, the process is terminated in step 28 and the circuit cannot be tested without damaging the three-state busses. If all of the busses have been resolved as determined in step 30, then for each bus, the system will check to make sure that the bus is satisfied at all times (step 32) and that it is satisfied at each time for each device (step 33) that is known to drive it. In step 34 for each driver at each recorded time interval of each bus, the minimum primary input assignments are traced in the manner described below in connection with FIG. 4 and each of the input assignments is then recorded in step 36.

Figure 3:
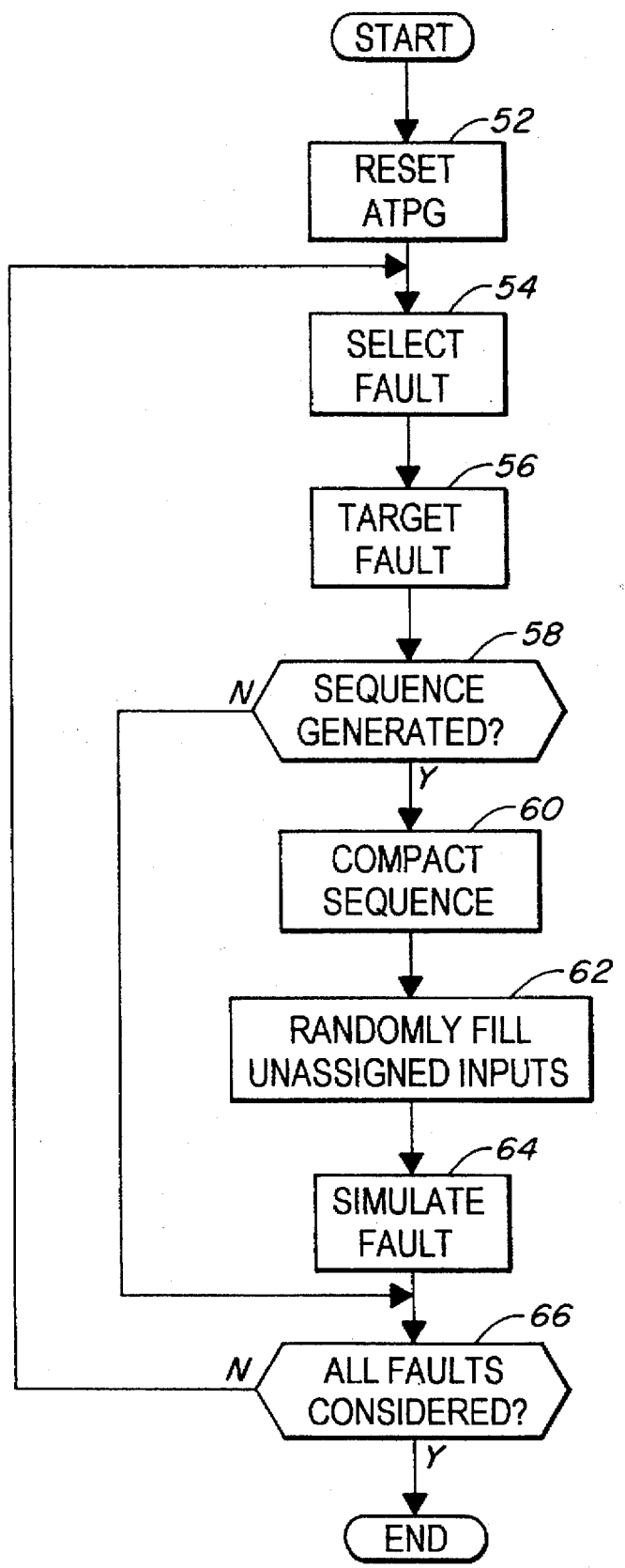
FIG. 3 is a flowchart of the steps utilized by the system and method of the present invention for generating tests.

Referring now to FIG. 3, the procedure for generating tests will now be described. The process will initially reset the ATPG engine in step 52. Then in step 54, the system chooses the primary fault to be targeted. In step 56 the system will then target such primary fault to determine whether a sequence of test vectors can be generated which will detect such fault. In step 58 the system determines whether such a sequence has been generated, and if so, it will then compact that sequence in step 60. After the sequence is compacted, any remaining unassigned inputs are given random assignments so as to maximize the number of faults detected by the sequence. In step 66 the system determines whether or not all of the desired faults have been targeted and if not, steps 54–66 are once again repeated. If all of the faults have been targeted, the procedure will then end in step 68.

Figure 4:
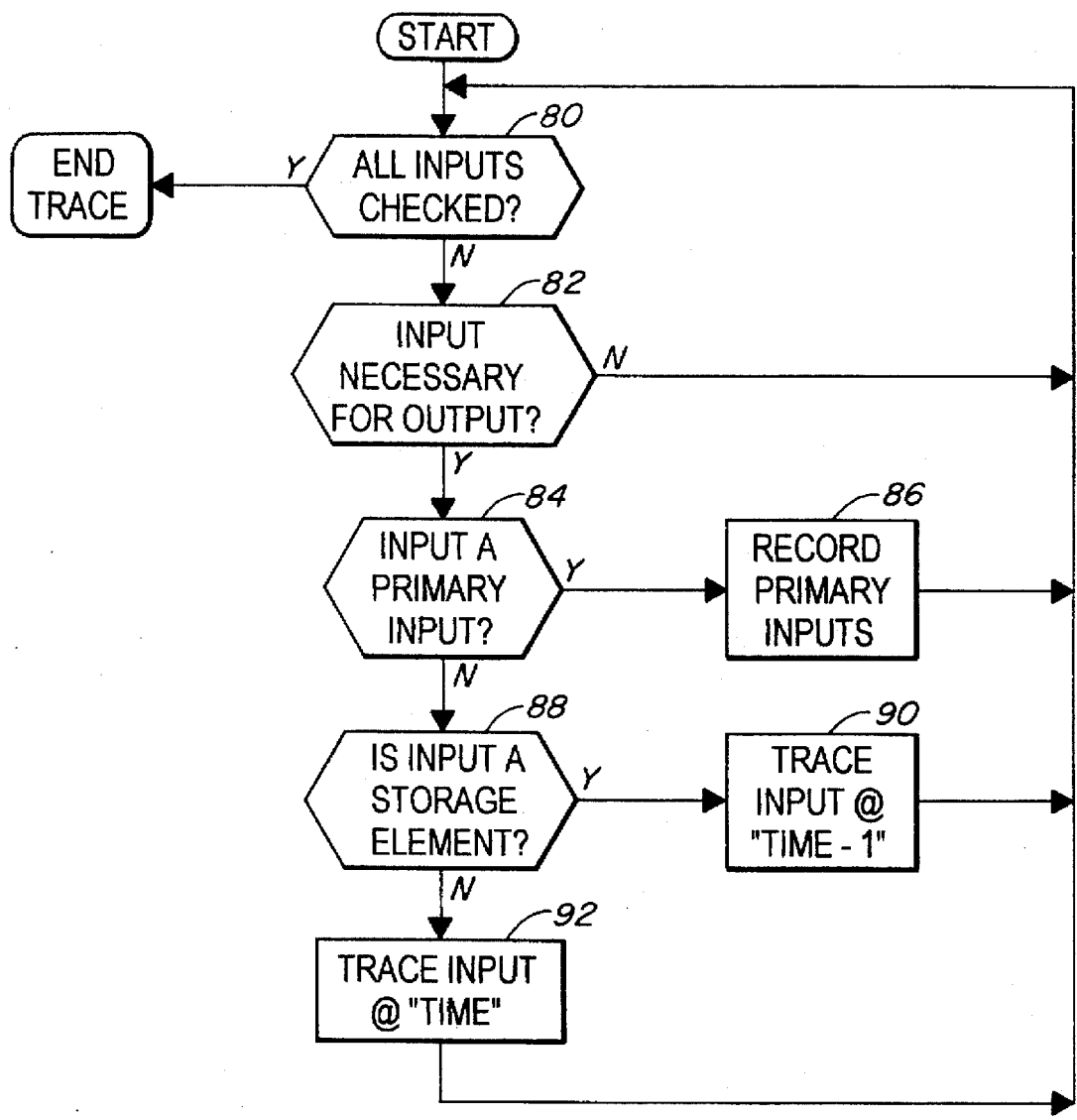
FIG. 4 is a flowchart of the steps implemented by the system and method of the present invention for tracing the minimum primary input assignments for each bus in a circuit under test.

Referring now to FIG. 4, the steps implemented by the system and method of the present invention for tracing the minimum primary input assignments will now be described. By "tracing the input" it is meant that the system will determine what sequence of primary input assignments are required to resolve a given three-state bus. The system looks at each bus and determines why it has not been damaged using gate and time assignments already assigned to each bus. In step 80 the system determines whether all input values have been checked and if they have not all been checked, the system then checks in step 82 whether the input value is necessary for producing an output value by examining the type of gate and the values at the inputs of such gate. If such input value is necessary, then in step 84, the system determines whether the input is a primary input by comparing the current input with a list maintained in memory of all primary inputs and scan inputs of the circuit. In the event that such input is a primary input, in step 86 a record is created in the database which identifies the input along with the relative time the input was applied and the output value produced by that input. If the system determines in step 88 that the input is a storage element, the system would backtrack to trace a primary input assignment for the input at a prior point in time. If the input was not a primary input or a storage element, the system will go back and trace the input, in which case the current trace node in the circuit changes. If the current node is not a primary input, then it must be driven by some logic gate in the circuit. The trace then continues at the appropriate inputs to that gate as described above in connection with step 82.

Figure 5:
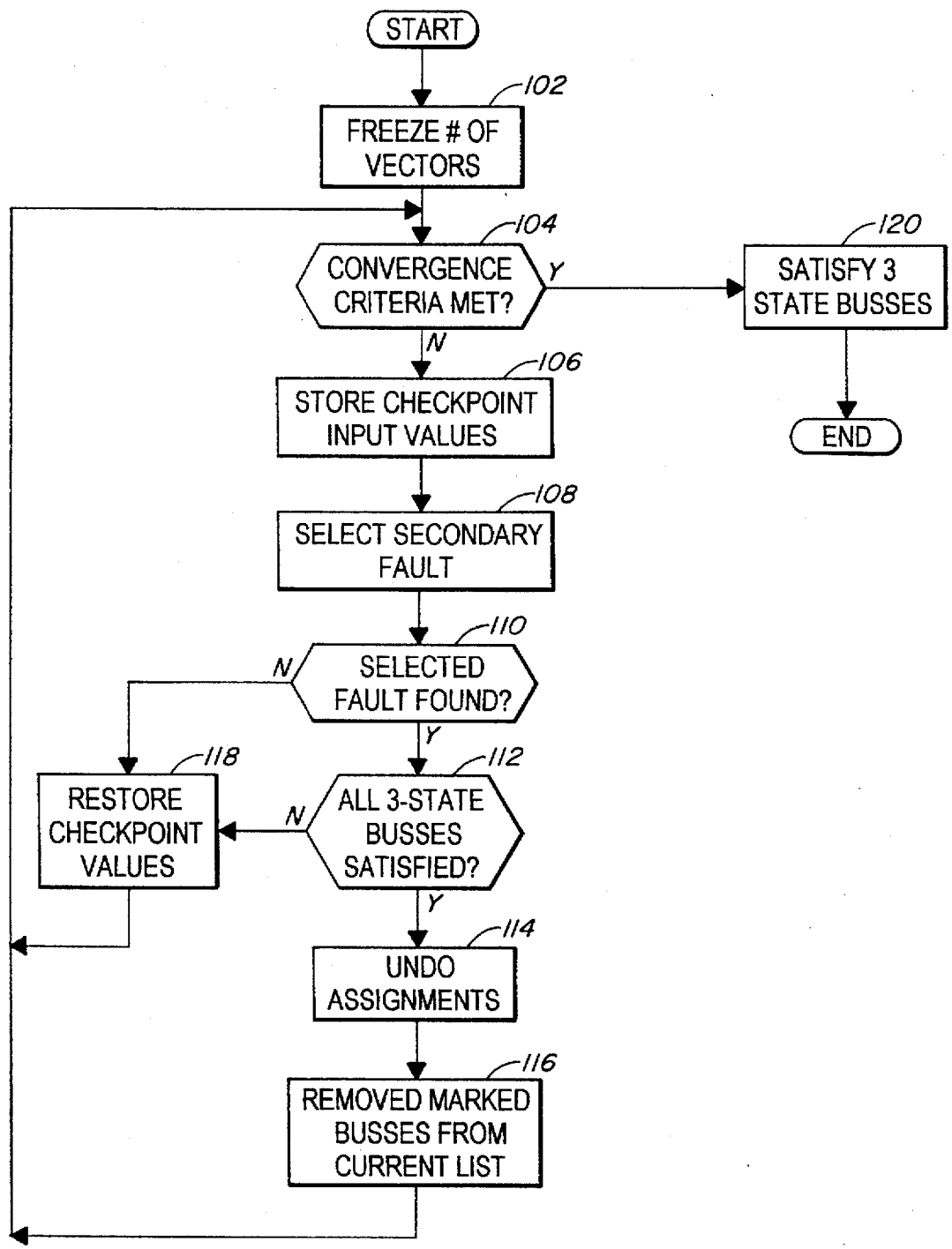
FIG. 5 is a flowchart of the steps implemented by the system and method of the present invention for compacting the test vectors in the sequence being generated.

Referring now to FIG. 5, as described above, once a sequence is generated the system will attempt to reduce the number of vectors in the sequence. This process begins by freezing the number of vectors in the sequence being considered in step 102. Then in step 104, the system checks to determine whether the convergence criteria have yet been met. This convergence criteria is determined by the user. The system will continue to try to compact the vectors in a sequence until it cannot reasonably expect to compact the sequence any further. In some embodiments, the convergence criteria is time based so that the system will attempt to compact the sequence for a selected length of time. An alternative convergence criteria is based on a check for a maximum number of secondary faults.

In step 106 the system saves the current form of the sequence so that when changes are later made to the sequence it is possible to review such changes. In step 108, the system then selects a secondary fault for which the circuit will be tested. In step 110, the system determines whether the secondary fault that has been targeted is found in the circuit. If it has been found, the system then determines in step 112 whether any of the three state busses are in conflict so that damage is possible. If no busses have been damaged, then the system in step 114 will undue such assignments to the test vectors that were required to prevent conflicts in the three-state busses. (Note that the assignments that were required to detect the secondary fault are not undone.) In step 116 all of the marked busses are removed from the current list of three-state busses that can still be resolved using the memorized sequence. If any of the busses are damaged, then the values in step 118 are restored from the check point values recorded in step 106. The system then once again, in step 104, determines whether the convergence criteria have been met, and if not, the process described above in connection with this FIG. 5 will be repeated. If the convergence criteria has been met, the system will then satisfy the three-states as described below with respect to FIG. 6.

Figure 6:
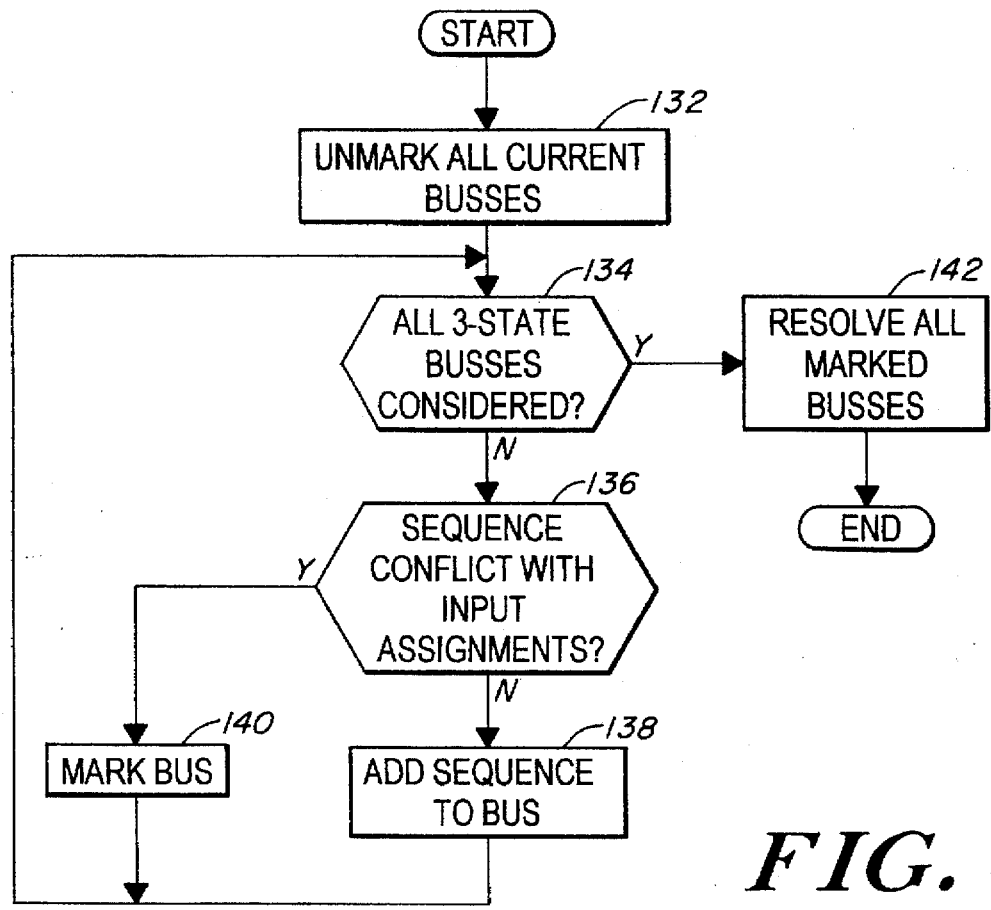
FIG. 6 is a flowchart of the steps implemented by the system and method of the present invention for satisfying all three-state busses in a circuit being tested.

Referring now to FIG. 6, to satisfy the three-state busses, the system will unmark all current busses so that all the three-state busses in the circuit will be considered in step 132. Then, for each three-state bus on the current list of busses, the system, in step 136, determines whether the sequence conflicts with the current input assignments. If it does not, the sequence is added to the bus in step 138 as a sequence that can be used to test such bus. If the memorized solution conflicts with the current input assignments, then the bus is marked in step 140 and the system again continues to check all three-state busses in the current list of three-state busses. Once all the busses have been checked, the system in step 142 will then try to resolve all of the marked busses in the same manner as described above. The marked busses are resolved by the same ATPG test product that was used in step 24 when the bus resolution database was built.

Figure 7:
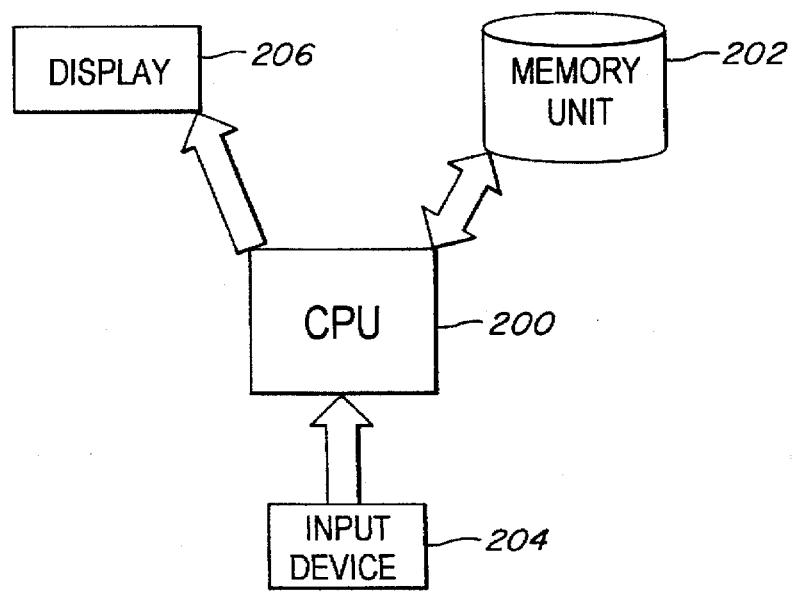
FIG. 7 is a block diagram of the components of the system of the present invention.

Most circuit designs are generated and tested with software tools running on an appropriate computer. As a result, the system of the present invention will need to be used in connection with computer generated circuit designs. Referring to FIG. 7 the system of the present invention is shown which includes a CPU 200 and one or more memory unit 202 for storing circuit designs, memorized solutions and other information generated by the method described above. An input device 204, such as a keyboard, is provided for specifying user inputs and variable information. Display device 206 is provided to enable a user of a system to examine the results of applying the method described above to a computer generated circuit design.

While the foregoing invention has been described with reference to its preferred embodiments, various alterations and modifications will occur to those skilled in the art. All such alterations and modifications are intended to fall within the scope of the appended claims.

What is claimed is:

1. A method for generating compact sequences of test vectors for testing a circuit design, said method comprising the steps of:

determining a first minimum set of primary input values to each three state bus in the circuit being tested, said primary input values being required to resolve said three state busses;

recording said first minimum set of primary inputs and a time value associated with each input, each of said time values indicating a relative place in time when said primary input is applied to one of said three-state busses;

targeting a primary fault to be detected in said circuit design and generating a sequence to detect said primary fault, said sequence including a second set of primary inputs;

targeting a secondary fault to be detected in said circuit design and generating a sequence to detect said secondary fault, said sequence including said second set of primary inputs;

attempting to satisfy all of said three-state busses with said first minimum set of primary inputs;

if all of said three-state busses can be satisfied with said first minimum set of primary inputs, substituting said second set of primary inputs for said recorded first minimum set of primary inputs.

2. The method for generating compact sequences of test vectors of claim 1 further comprising the step of verifying that all three-state busses can be satisfied by said second set of primary inputs prior to said step of attempting to satisfy all of said three-state busses.

3. The method for generating compact sequences of test vectors of claim 1 further comprising the step of discarding said second set of primary inputs if said second set of primary inputs cannot satisfy all of said three-state busses in said circuit design.

4. The method for generating compact sequences of test vectors of claim 1 further comprising the steps of meeting convergence criteria and repeating said steps of targeting a secondary fault, attempting to satisfy all of said three-state busses and substituting said second set of primary inputs until said convergence criteria are met.

5. The method for generating compact sequence of test vectors of claim 1 further comprising the steps of:

fault simulating said first minimum set of primary inputs; and dropping any detected faults from the master fault list.

6. A system for generating compact sequences of test vectors for testing a computer generated circuit design, said system comprising:

a CPU for
   (a) determining a first minimum set of primary input values to each three state bus in the circuit being tested, said primary input values being required to resolve said three state busses;
   (b) targeting a primary fault to be detected in said circuit design and generating a sequence to detect said primary fault, said sequence including a second set of primary inputs;
   (c) targeting a secondary fault to be detected in said circuit design and generating a sequence to detect said secondary fault, said sequence including said second set of primary inputs;
   (d) attempting to satisfy all of said three-state busses with said first minimum set of primary inputs;
   (e) substituting said second set of primary inputs for said recorded first minimum set of primary inputs if all of said three-state busses can be satisfied with said first minimum set of primary inputs, memory unit for recording said first minimum set of primary inputs and a time value associated with each input, each of said time values indicating a relative place in time when said primary input is applied to one of said three-state busses.

7. The system for generating compact sequences of test vectors of claim 6 wherein said CPU verifies that all three-state busses can be satisfied by said second set of primary inputs prior to attempting to satisfy all of said three-state busses.

8. The system for generating compact sequences of test vectors of claim 6 wherein said CPU deletes further said second set of primary inputs from said memory unit if said second set of primary inputs cannot satisfy all of said three-state busses in said circuit design.

9. The system for generating compact sequences of test vectors of claim 6 wherein said CPU determines if convergence criteria have been met.

10. The method for generating compact sequence of test vectors of claim 6 wherein said CPU fault simulates said first minimum set of primary inputs; and drops any detected faults from the master fault list.

* * * * *